United States Patent
Han et al.

(10) Patent No.: US 7,485,488 B2
(45) Date of Patent: Feb. 3, 2009

(54) BIOMIMETIC APPROACH TO LOW-COST FABRICATION OF COMPLEX NANOSTRUCTURES OF METAL OXIDES BY NATURAL OXIDATION AT LOW-TEMPERATURE

(75) Inventors: Mingyong Han, Singapore (SG); Zhongping Zhang, Singapore (SG)

(73) Assignee: Agency for Science, Technology and Research, Centros, Singapore (SG)

( * ) Notice: Subject to any disclaimer, the term of this patent is extended or adjusted under 35 U.S.C. 154(b) by 18 days.

(21) Appl. No.: 11/104,581

(22) Filed: Apr. 13, 2005

(65) Prior Publication Data

US 2005/0255629 A1 Nov. 17, 2005

Related U.S. Application Data

(60) Provisional application No. 60/562,228, filed on Apr. 15, 2004.

(51) Int. Cl.
*H01L 21/00* (2006.01)
(52) U.S. Cl. .............................. 438/104; 257/43; 257/78; 257/614; 257/E29.094; 257/E33.019; 257/E31.015; 977/762; 977/811; 977/892
(58) Field of Classification Search .................. 438/104; 257/43, 78, 614, E29.094, E31.015, E33.019; 977/762, 811, 892
See application file for complete search history.

(56) References Cited

U.S. PATENT DOCUMENTS

2006/0197436 A1 * 9/2006 Conley et al. ............... 313/498

OTHER PUBLICATIONS

Wen et al., Langmuir 2003, 19, 5898-5903.*
Greene et al., Angew. Chem. Int. Ed. 2003, 42, 3031-3034.*
Matijević, Langmuir 1986, 2, 12-20.*
Asku et al. J. Electrochem. Soc., 149 (6) G352-G361 (2002).*
Boyle et al. (Chem. Commun., 2002, 80-81).*
Carnes et al. (Langmuir 2000, 16, 3764-3772).*
Chen et al. (J. Crystal Growth, 2002, 240, 467-472).*
Liu et al. (J. Am. Chem. Soc., 2003, 125, 4430-4431).*
Monge et al. (Angew. Chem. Int. Ed., 2003, 42, 5321-5324).*
Park et al. (J. Mater. Chem., 2004, 14, 35-36).*
Peulon et al. (J. Electrochem. Soc., 1998, 145, 864-874).*
Shim et al. (J. Am. Chem. Soc., 2001, 123, 11651-11654).*
Tang et al. (Chem. Commun., 2004, 712-713).*
Tian et al. (J. Am. Chem. Soc., 2002, 124, 12954-12955).*
Tian et al. (Nature Materials, 2003, 2, 821-826).*
Vayssieres (Adv. Mater., 2003, 15, 464-466).*
Vayssieres et al. (Chem. Mater. 2001, 13, 12, 4395-4398).*
Vayssieres et al. (J. Phys. Chem. B, 2001, 105, 3350-3352).*
Wong et al. (Nanotechnology, 2003, 14, 968-973).*
Zheng et al. (Chem. Phys. Lett., 2002, 363, 123-138).*

(Continued)

*Primary Examiner*—Richard Elms
*Assistant Examiner*—Michael Lulis
(74) *Attorney, Agent, or Firm*—Birch, Stewart, Kolasch & Birch, LLP

(57) ABSTRACT

A metal oxide nanostructure is formed by oxidizing metallic metal in the presence of a solution containing a liquid ligand to form a metal-ligand complex, and decomposing the metal-ligand complex to form the metal oxide nanostructure. The metal-ligand complex can be a complex of zinc or copper with formamide. In one form, the nanostructure forms ZnO nanorods having a diameter of 10 to 1000 nm, where the nanorods having a hexagonal crystallographic morphology, and the nanorods are oriented perpendicular to a substrate.

16 Claims, 17 Drawing Sheets

OTHER PUBLICATIONS

Zhang et al., "Near-Room-Temperature Production of Diameter-Tunable ZnO Nanorod Arrays through Natural Oxidation of Zinc Metal", Chem. Eur. J. 2005, 11, 3149-3154.*

Yu et al., "A General Low-Temperature Route for Large-Scale Fabrication of Highly Oriented ZnO Nanorod/Nanotube Arrays", J. Am. Chem. Soc. 2005, 127, 2378-2379.*

* cited by examiner

A

B

C

BIOMIMETIC APPROACH TO LOW-COST FABRICATION OF COMPLEX NANOSTRUCTURES OF METAL OXIDES BY NATURAL OXIDATION AT LOW-TEMPERATURE

This application claims priority under 35 U.S.C. §119 of provisional application No. 60/562,228, filed Apr. 15, 2004, the entire contents of which are hereby incorporated by reference.

BACKGROUND OF THE INVENTION

1. Field of the Invention

The invention relates to metal oxide nanostructures formed by natural oxidation at low temperatures.

2. Description of the Related Art

Metal oxides have increasing applications in semiconductors due to their wide bandgap and large excitation binding energy. As a typical wide-bandgap semiconductor oxide with a large excitation binding energy (about 60 meV), zinc oxide is one of the more important functional materials having unique properties of near ultraviolet emission, optical transparency, electrical conductivity and piezoelectricity.

In order to develop technologies to obtain ultraviolet lasing from metal oxide (e.g., zinc oxide) nanorods, it is necessary to develop methodologies to produce one-dimensional (1D) metal oxide nanostructures suitable for applications in electronic and optoelectronic devices. Especially, large-scale and low-cost controllable growth of well-aligned ZnO nanorods on suitable substrates is desired for these cutting-edge applications.

Related art methods of producing nanorods include high-temperature vapor-phase processes that are expensive and energy-intensive. The temperatures required for these processes typically range from 900 to 1100° C. As a result, liquid phase coating of substrates with nanoparticles cannot be accomplished using high-temperature vapor phase processes. However, the complex solution chemistry of these schemes has yielded a complex technology prone to producing irreproducible results.

A typical related art approach to producing ZnO nanoparticles entails the synthesis of metal oxides from organometallic precursors using a two-step approach: (i) the formation of metal nanoparticles from an organometallic precursor, and (ii) oxidation of the metallic nanoparticles. Alternately, unstable organometallic systems (which oxidize readily) are utilized. For example, a complicated system of bisalkyl zinc is oxidized in a solution of hexadecylamine and tetrahydrofuran (M. Monge et al. Angew. Chem. Int. ed., 2003, 42, 5321-5324). Other approaches to metal oxide nanoparticles were also reported previously.

Copper oxide has also been of considerable interest because it forms the basis of technologically important materials such as high-temperature superconductors and plays practical roles in catalysis, sensing, and solar energy technology. Conventional methods of forming copper oxide nanoparticles include thermal decomposition, oxidation, reduction and hydrolysis of metal or metal salts. However, there is still a need for simple technologies to form copper oxide nanomaterials from solutions at moderate, i.e., room, temperatures from simple aqueous solutions.

Accordingly, modern semiconductor and laser technology requires reliable and reproducible new metal oxide materials that are easy and inexpensive to prepare.

SUMMARY OF THE INVENTION

Accordingly, the invention is directed to producing a metal oxide nanomaterial that substantially obviates one or more problems due to limitations and disadvantages of the related art.

An object of the invention is to provide a metal oxide nanomaterial that can be formed at room temperature using simple solution chemistry. The invention can provide a metal oxide nanomaterial without the use of complex organic ligands.

The invention, in part, pertains to a method for manufacturing a metal oxide nanostructure that includes oxidizing metallic metal in the presence of a solution containing a ligand such as a liquid amine to form a metal-ligand complex, and decomposing the metal-ligand complex to form the metal oxide nanostructure. The metal oxide nanostructure can be formed on a substrate having a lattice match with the metal oxide to be deposited. The metal can be selected from all the transition metals that can form complexes with ligands with functional groups such as amine, carboxyl, aldehyde, etc. The metal can be any transition metal such as of Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au or Hg. The metal can preferably be Zn, Cu, Fe or Ni. The metal can most preferably be zinc or copper and the metal oxide is then zinc oxide or copper oxide. When the nanostructure is ZnO, it can be formed on a substrate of metallic zinc or a ZnO film-coated substrate. When the nanostructure is CuO, it can be formed on a substrate of metallic copper or a CuO film-coated substrate.

In the invention the liquid amine can be at least one of $HCONH_2$, $HCON(CH_3)_2$, $HCON(CH_2CH_3)_2$, $HCON(CH_2CH_2CH_3)_2$, $HCONH$-n-butyl, $HCONH$-iso-butyl or $HCONH$-tert-butyl. The metal amino complex can be Zn-formamide or Cu-formamide. The decomposing can be performed in the presence of dissolved oxygen. The metal oxide nanostructure can be ZnO nanorods or dendritic CuO. The ZnO nanorods can have a diameter of 10 to 1000 nm, preferably a few tens to 1000 nm. The ZnO nanorods can also have a diameter of 80 to 170 nm. The solution can be a 2-10% aqueous solution of $HCON_2$ or higher. The solution can further contain an amino acid. The temperature can be 0-100° C. or higher in some cases, preferably 65° C. Also, oxygen is dissolved in the liquid amine.

The invention, in part, pertains to a method or manufacturing a metal oxide nanostructure that includes immersing a metal in a solution of 2-10% aqueous $HCONH_2$. The metal can be a metal foil such as a zinc foil or a copper foil. The temperature can be 65° C. The nanostructure can be ZnO nanorods having a diameter of 80 to 170 nm.

The invention, in part, pertains to a metal oxide nanostructure formed from ZnO nanorods having a diameter of 10 to 1000 nm, preferably a few tens to 100 nm, where the nanorods have a hexagonal crystallographic morphology, and the nanorods can be oriented perpendicular to a substrate. The nanorods can also have a diameter of 80 to 170 nm. Immersing metallic zinc in an aqueous amine solution forms the nanorods.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION

Figure 1:
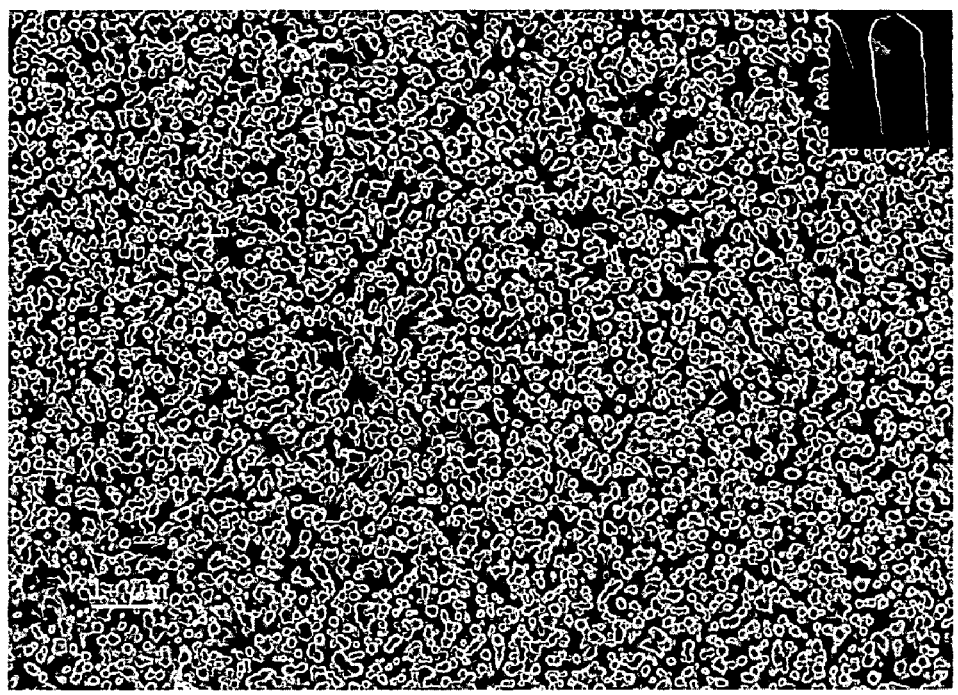
FIG. 1 shows SEM image of ZnO nanorod array grown directly from Zn foil in 5% formamide aqueous solution at 65° C.

Reference will now be made in detail to the preferred embodiments of the invention, examples of which are illustrated in the accompanying drawings.

The invention fabricates metal oxide nanostructures from aqueous solutions at moderate temperatures. The invention produces the simple self-seeding growth of uniform, large area metal oxide nanoarrays at low temperatures. The invention also eliminates the requirement for using exotic metals as catalysts or metal oxides as seed particles. The exclusion of exotic metal catalysts and counterions is an important advantage when fabricating reliable devices, because even very low impurity concentrations can incorporate dopant species into semiconductor nanorods to generate unintentional defect levels that significantly effect device properties.

The invention utilizes the slow oxidation of a metal such as zinc by naturally dissolved oxygen with the help of an organic ligand, preferably formamide ($HCONH_2$), which leads to the continuously releasing of metal ions (for example $Zn^{2+}$ or $Cu^{2+}$ ions) into the liquid phase in the form of an amino complex. The aligned metal oxide nanorods covering the metal surface are made by the simultaneous thermal decomposition of metal-formamide complex. The diameters of nanorods are tunable from several ten to a few hundred nanometers by simply changing the formamide concentration in aqueous solution.

When considering zinc, due to the coordinating ability of formamide molecules with metal ions, the resultant $Zn^{2+}$ ions release continuously from zinc substrate into solution phase in the form of complexing $[Zn(HCONH_2)_n]^{2+}$ ions, which overcomes thus the passivation effect of metal surface. Under hydrothermal condition, the decomposition of complexing compound occurs simultaneously at low temperature, providing the growth of ZnO on the Zn substrate.

The synthesis of 1D ZnO nanostructures using metallic zinc as a precursor entails using pure or almost pure zinc as a precursor at near room temperature (65° C.). The synthetic principle is based on the slow oxidation of metal zinc by naturally dissolved oxygen with help of organic ligand formamide ($HCONH_2$), which leads to the continuously releasing of $Zn^{2+}$ ions into liquid phase in the form of an amino complex. The aligned ZnO nanorods covering the Zn surface are made by the simultaneous thermal decomposition of the Zn-formamide complex. The diameters of the nanorods are tunable from several tens to a few hundred nanometers by simply changing the formamide concentration in aqueous solution.

EXAMPLE 1

The oxidation of metal zinc under control of formamide molecules and the growth of ZnO nanorod arrays was carried out in a 4-ml glass vial. Before use, high-purity zinc foils were carefully washed in an ultrasonic bath of absolute ethanol. Formamide was used directly without further purification. In a typical procedure, a piece of zinc foil was immersed into 1.5 ml aqueous formamide ($HCONH_2$) solution. The formamide content in the water varied within a range of 2-10%. The vial was then heated in a drying oven at a constant temperature of 65° C., and kept still for 24 hours. It could be observed that the surface of Zn substrate was tarnished gradually and a thin layer of white ZnO covers the entire surface of substrate. The zinc foil was taken out and washed with alcohol and deionized water, and dried at room temperature before characterization.

FIG. 1 shows a typical scanning electron microscope (SEM) image of the materials grown on a zinc substrate in 5% formamide aqueous solution for 24 hours. The image confirms that a high density of well-oriented nanorods uniformly grew over the entire substrate. The diameters of these nanorods range from 80 to 170 nm, whereas most of the nanorods have a diameter of 140 nm. The hexagonal end face and perfect side surfaces of the nanorod can be clearly identified in the inset image of FIG. 1. The well-defined hexagonal crystallographic morphology provides strong evidence that all nanorods grow along the <0001> direction and are indeed well-faceted crystals.

Figure 2:
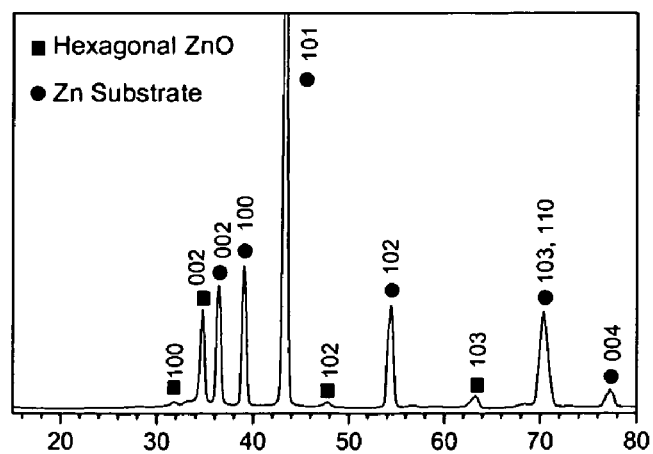
FIG. 2 shows the X-ray diffraction pattern of a highly oriented ZnO nanorod array the grown on a Zn substrate.

The corresponding XRD pattern of zinc foil with the ZnO nanorod array is depicted in FIG. 2. In addition to diffraction peaks of the Zn substrate, the (002) diffraction peak in the ZnO diffraction pattern is distinguishingly strong, whereas other peaks are either extremely weak or not detected. This indicates that the nanorods within the array are grown along c-axis direction, and are oriented preferentially in a perpendicular fashion onto the substrate.

The oriented ZnO nanorods on the substrate with various average diameters were synthesized using the simple liquid-phase procedure by adjusting the formamide content of solution. The evolution of the rod array morphology with amount of formamide in solution is clearly shown in SEM images of FIG. 3.

Figure 3A:
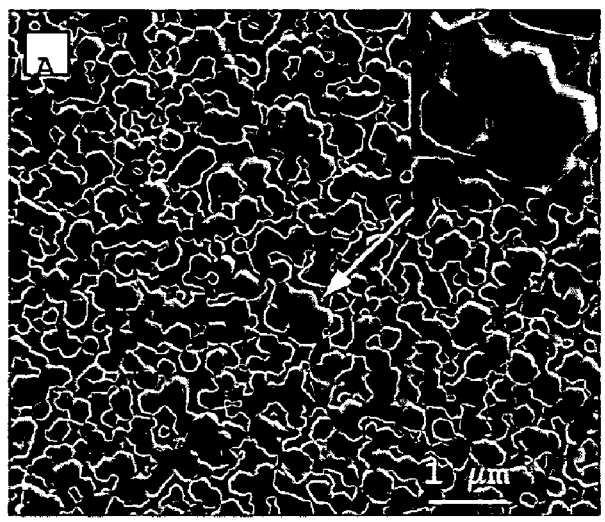
FIG. 3A shows an SEM image of a ZnO array grown from a 10% formamide aqueous solution.

FIG. 3A shows an SEM image of a ZnO array grown from a 10% formamide aqueous solution, where large, well-formed nanotubes having a regular hexagonal morphology can be readily observed (see insert). The diameter of the ZnO nanotubes can be observed to range from about 0.3 to 0.5 μm.

Figure 3B:
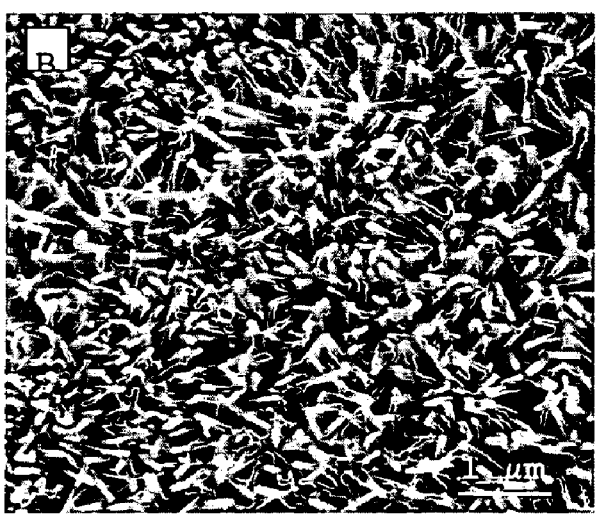
FIG. 3B shows an SEM image of a ZnO array grown from a 2% formamide aqueous solution.

FIG. 3B shows an SEM image of a ZnO array grown from a 2% formamide aqueous solution, where the nanowires have a smaller diameter than those formed from a 10% formamide solution. Here, the nanowires have a diameter of about a few tens to a few hundred nanometers.

EXAMPLE 2

Figure 7A:
FIG. 7A shows an TEM image of nanorod morphology and SAED pattern of the selected nanorod.
Figure 7B:
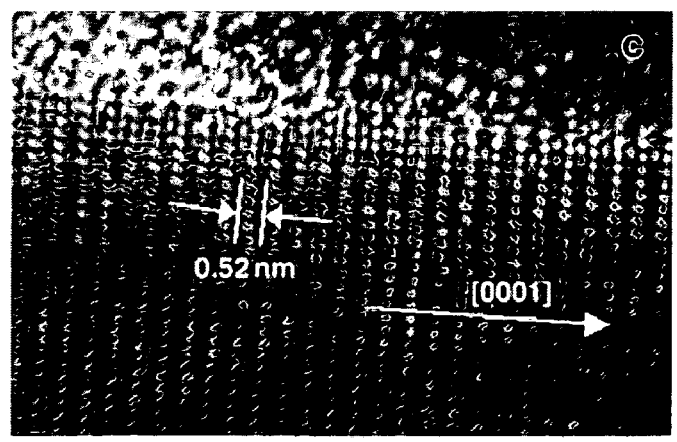
FIG. 7B shows a high-resolution TEM image of an isolated nanorod, as indicated in FIG. 7B.

Using materials similar to Example 1, ZnO nanorods were grown onto a zinc substrate form a 5% formamide solution at 65° C. for 24 hours. The resulting rods had a well-faceted hexagonal diameter of about 140 nm and were very densely packed on the substrate. X-ray diffraction analysis identified the structure to be Wurtzite ZnO, and that the preferential growth direction of the nanorods was along the c-axis or highly oriented c-axis alignment of nanorods over a large substrate area. Referring to FIG. 7A, TEM analysis of nanorods removed from the Zn substrate showed that the nanorods were about 1.6 μm in length and had a uniform diameter along the entire length. Selective Area Electron Diffraction (SAED) determined that the nanorods were single crystals grown along the [0001] direction. In FIG. 7B, TEM analysis revealed a lattice spacing of 0.52 nm, which corresponds to a d-spacing of (0001) crystal planes, further confirming <0001> to be the preferential growth direction.

The anisotropic growth of ZnO crystals along the [0001] direction may be caused by inherent polar properties along the c-axis. The velocities of crystal growth in different crystallographic planes are:

$$V_{<01\bar{1}0>} > V_{<01\bar{1}1>} > V_{<000\bar{1}>} = V_{<0001>}$$

Strong room-temperature photoluminescence spectra of the resulting ZnO nanoarrays can exhibit a near band-edge emission using a He—Cd laser as an excitation source.

Figure 4:
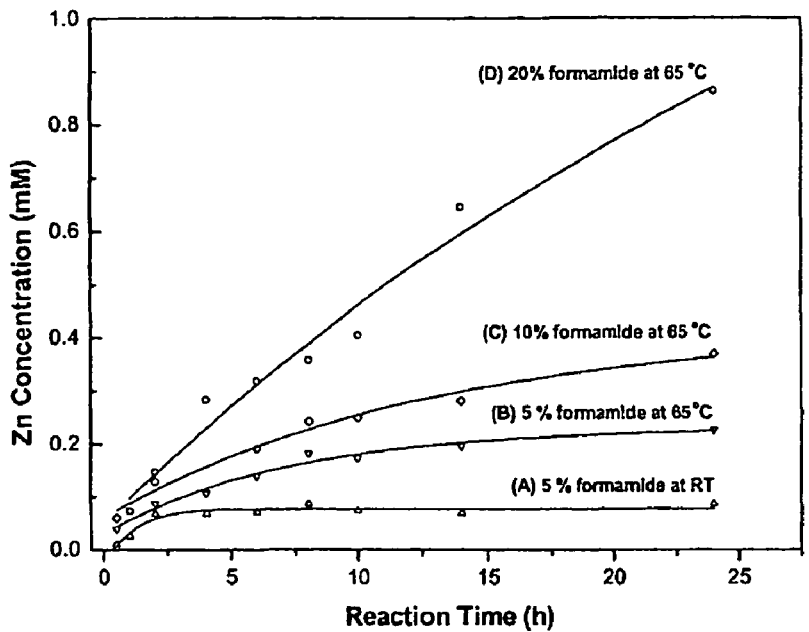
FIG. 4 shows the evolution of ZnO from solution as a function of time at different formamide concentrations.

To understand the formation mechanism of ZnO nanorods on a substrate at elevated temperature, the kinetic process of crystal growth was studied in 5% formamide aqueous solutions. FIG. 4 shows the evolution of Zn as a function of time from solutions of 5%, 10% and 20% formamide at 65° C., where 5% formamide at room temperature was used as a control.

In FIG. 4, the zinc concentration increases proportionally with reaction time due to the continuous release of zinc ions into solution, and Zn complexes can accumulate up to 0.23 nM gradually after 24 hours in 5% formamide solution. In 5% formamide at 65° C., the oxidation of metallic zinc is initially very slow, and the resulting low level of zinc concentration can induce heterogeneous nucleation preferentially on a zinc substrate. With prolonged reaction time, freshly produced Zn species can be continuously supplied for the subsequent crystal growth on the heterogeneous nuclei through the thermal decomposition of the resulting Zn-formamide complexes.

For example, after 5 hours of ZnO growth from a 5% formamide solution at 65° C., a sub-monolayer of uniform ZnO seed particles about 120 nm in size were observed.

Figure 5:
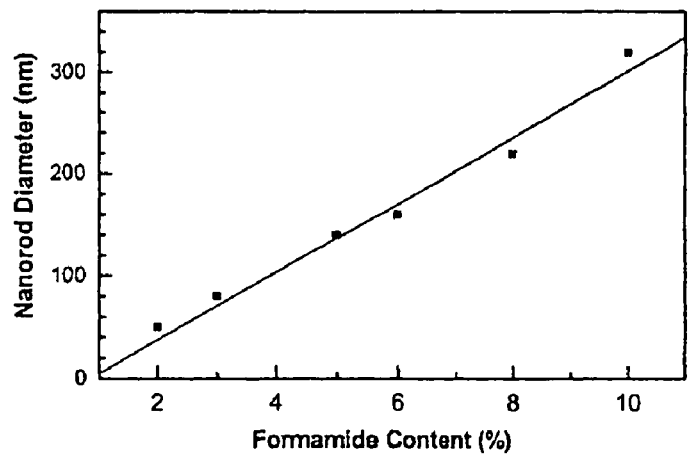
FIG. 5 shows the relationship between nanorod diameter and formamide content.

The size of the ZnO nanorods can be tuned by manipulating the concentration of formamide. FIG. 5 shows the relationship between nanorod diameter and formamide content for growth for 24 hours at 65° C. with formamide contents of 2, 3, 5, 6, 8 and 10%. Increasing the formamide content for 2 to 5 to 10% gradually increases the average diameter of the nanorods from 50 to 140 to 320 nm. The average diameter of the ZnO nanorods increases proportionally with increasing formamide content. This linear relationship demonstrates that adjusting the predetermined content of formamide can control the nanorod diameter.

As was shown in FIG. 4, increasing the formamide content from 2, 5, 10 to 20% will increase the zinc concentration after 24 hours at 65° C. to 0.12 0.23, 0.37, and 0.86 mM respectively. Although not shown in FIG. 4, increasing the formamide content to 40% will yield a concentration of 1.49 mM after 24 hours at 65° C. This increased supply rate of Zn-formamide complexes shows the formation of thicker nanorods result from increasing the formamide content. It has been observed that within a range of 2-10% formamide, ZnO nanorods or nanowires can be grown on a zinc substrate exclusively. When the formamide concentration is increased to 20%, zinc complexes were accumulated to a much higher concentration level to lead to crystal overgrowth of irregular nanorods on the substrate.

However, when a 2% formamide solution was used, ZnO nanowires of 50 nm diameter were produced having a regular-edged shape and Wurtzite single-crystalline structure preferentially grown along the c-axis.

For the growth mechanism of oriented nanorod arrays, heterogeneous nucleation at the initial stage is important for vertical and in-plane alignments of nanorods. In the invention, foreign seed particles were not introduced to grow the ZnO nanorod, the heterogeneous nucleation may occur at any site on the substrate for catalyst-free crystal growth. Since both Zn and ZnO have hexagonal crystal structure with lattice constants of a=0.2665, c=0.4949 and a=0.3249, c=0.5206, respectively, ZnO tends to have an epitaxial orientation relationship of lattice planes with the base zinc metal. Therefore, the epitaxial heterogeneous nucleation results in a uniform distribution of ZnO particle seeds on the substrate in the invention, and oriented 1D nanostructures are grown due to the epitaxial relationship of the lattice planes between the nanorod and the substrate. As has been observed (see, e.g., FIG. 3A) nearly all the nanorods grow vertically from the substrate. For those nanorods that do not grow vertically, their growth may become physically limited as the misaligned nanorods begin to impinge on other neighboring crystals.

Figure 6:
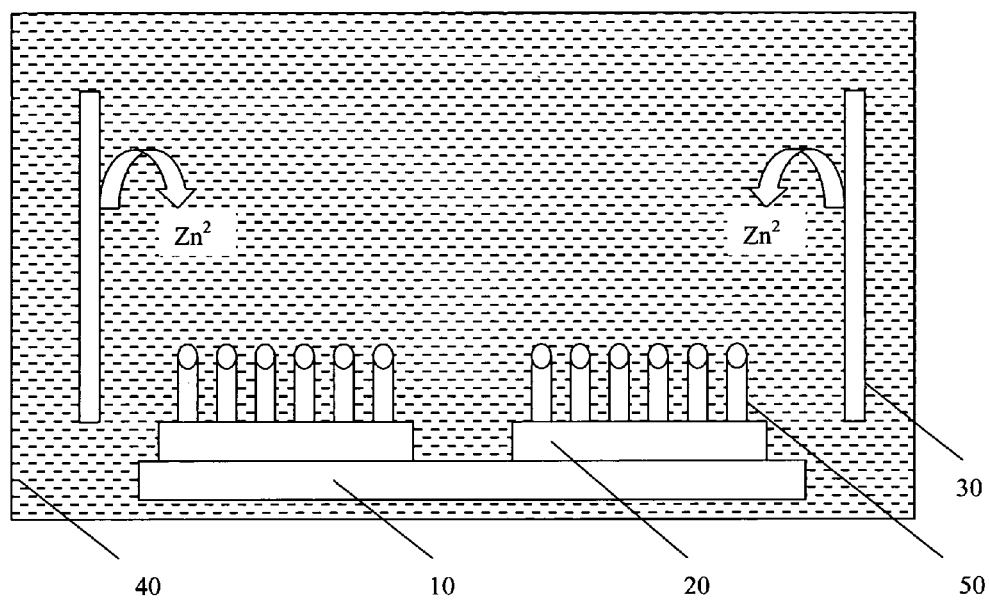
FIG. 6 schematically shows the growth of metal oxide nanotubes over a metal oxide coated substrate.

In a preferred embodiment of the invention, nanostructures can be grown over almost any substrate. FIG. 6 schematically shows the growth of metal oxide nanotubes over a metal oxide coated substrate, where Zn is preferably the metal component.

In FIG. 6, substrate 10 can be any suitable material, such as glass, quartz, silicon, GaAs, polyethylene terephthalate, etc. Over substrate 10 is coated a metal oxide 20 which can be ZnO, Al-doped ZnO, indium tin oxide (ITO), indium zinc oxide (IZO), etc. Metal foils 30 are arranged in a formamide solution 40 to form the metal formamide complex that feeds the growth of the nanorods 50.

EXAMPLE 3

A glass substrate was coated with an approximately 150 nm thick ZnO film using radio-frequency magnetron sputtering. The coated substrate was placed in a 5% formamide solution for 24 hours at 65° C., where Zn foils were arranged in the solution around the periphery of the substrate. As a result, there was a gradient in concentration of zinc precursors from the Zn foil to the ZnO coated film substrate in the solution. At the lower concentration region around the ZnO-film-coated substrate, the diffusion rate of the zinc precursors is relatively fast with respect to the growth of the liquid-solid interface. The concentration of zinc precursors is uniform throughout the surface of seed particles on the ZnO-film-coated substrate, and growth takes place on entire seed particles to give rise to solid nanorods. At higher zinc concentration regions near the zinc foils, the growth rate has increased with respect to the rate of diffusion, and the zinc concentrations are largely decreased close to the top area of 1D ZnO nanostructures, leading to the preferential growth of nano-walls and limiting the growth of nanorods.

EXAMPLE 4

One ZnO-film-coated substrate and two 7×7 mm zinc foils were immersed in 3 mL of 5% formamide aqueous solution (v/v) in a 10 mL sample vial followed by 24 hours heating at a constant temperature of 65° C. The substrates were then rinsed with ethanol and dried in air before characterization. The whole substrate was successfully covered with uniform and dense arrays of hexagonal ZnO nanorods having a diameter of approximately 100 nm. The XRD pattern of the nanoarrays shows only a sharp (002) diffraction peak at 34.26° (full width at half maximum: about 0.6-0.7°), indicated a highly preferential growth of ZnO nanorods along the c-axis orientation (perpendicular to the substrate surface). The obtained strong near-uv emission peak of the ZnO nanorod array centered at approximately 400 nm and is attributed to near band-edge transition. Also, a ZnO nanotube array on a zinc foil produced nanotubes having diameters of 200-300 nm, typically with a mean diameter of approximately 250 nm and a uniform wall thickness of approximately 30 nm.

In this embodiment of the invention, the mean diameter of ZnO nanorods grown on the substrate (approximately 100 nm) is much smaller than that of nanotubes grown on zinc foils (approximately 250 nm) because of the much higher seed density on the ZnO-film-coated substrate than the nucleation sites on native oxide layer of zinc foil. The resulting thinner nanorods on the ZnO-film-coated substrate are more stable due to their small top area of polar metastable (001) surface and large lateral area of most stable low-index non-polar surfaces (parallel to the c-surface). However, on a zinc surface, it may not be energetically favored to form thicker solid ZnO nanorods due to their large top area of metastable (001) surface. Instead, the formation of thicker hollow ZnO nanotubes can reduce the top metastable area and enlarge the lateral area of the most stable low-index nonpolar surfaces with respect to their corresponding solid nanorods.

In the invention, surface-stabilized nanoparticles act as nanoscale building blocks that can spontaneously self-assemble into various ordered nanostructures in a process that is usually controlled by altering the surface properties of particles. The oriented aggregation growth of nanoparticles into low-dimensional crystalline nanomaterials can be attained through linearly oriented attachment. The oriented aggregation of nanoparticles is suitable for the formation of low dimensional crystalline materials such as ZnO nanorods, CdTe nanowires, $\alpha$-$Fe_2O_3$ disks/ellipsoids and monocrystalline CuO.

For example, monocrystalline CuO can be grown from nanoparticles at room temperature in an anisotropic aggregation-based crystal growth process. A few hundred monoclinic CuO nanoparticles can thus be grown into uniform ellipsoidal monocrystalline architectures.

Stepwise orientation and aggregation of a large number of nanoparticles in three dimensions has been observed, from the formation of primary CuO nanoparticles, to the preferential one-dimensional (1D) orientation of nanoparticles along the (001) direction at an early stage. Eventually, 3D-oriented aggregation forms a monocrystalline structure built from nanoparticles. Selective adsorption of formamide molecules on different crystallographic planes of monoclinic CuO nanoparticles plays an important role in the anisotropic growth of uniform nanoparticle-built monocrystals.

EXAMPLE 5

A piece of pure copper foil (10 mm×10 mm×0.127 mm) was immersed in 2 mL of formamide in a 10 mL vial at room temperature. Copper metal was oxidized slowly by naturally dissolved oxygen in formamide (<0.05% water). $Cu^{2+}$ ions were continuously released from the copper foil into the formamide (without introducing counterions such as $Cl^-$), which oxygen was simultaneously reduced:

$$O_2 + 2H_2O + 4e^- \rightarrow 4OH^- \quad (1)$$

With increasing reaction time, the solution gradually changed from colorless to light blue, and eventually to deep blue. This indicates the formation of $[Cu(HCONH_2)_4]^{2+}$ complex ions, because copper ions can be immediately captured and coordinated by formamide molecules, forming copper-complex ions after release from copper metal:

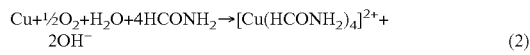

$$Cu + \tfrac{1}{2}O_2 + H_2O + 4HCONH_2 \rightarrow [Cu(HCONH_2)_4]^{2+} + 2OH^- \quad (2)$$

After six days, a total concentration of copper-complex ions of up to 60 nM was attained, as measured by atomic emission spectroscopy. The resulting solution was then diluted by a factor of five with deionized water (0.2 mL original solution was mixed with 1 mL water). The mixed solution was left to stand at room temperature and a brownish-black precipitate was observed after about 12 hours. The flocculent precipitate was aged for one week before samples were isolated for measurement.

Powder x-ray diffraction (XRD) confirmed the formation of crystalline CuO (cupric oxide). Low magnification transmission electron microscopy (TEM) showed the particles to have average lengths and widths of about 45 nm and about 130 nm, respectively. The primary small nanoparticles interconnected with one another to form larger secondary ellipsoidal architectures with recognizable boundaries or voids between the component subunits. High resolution TEM showed the obvious aggregation of nanoparticles. Selected area electron diffraction (SAED) of some single nanoarchitecture was indexed to monoclinic CuO with phase purity and (001) orientation. The diffraction pattern gave an average orientation distribution of about 5°, measured from arc angles/lengths in the diffraction pattern.

It was also observed that all the SAED patterns of single isolated ellipsoids show identical diffraction patterns along the (001) direction of CuO. This is attributed to the flat nature of the ellipsoidal particles, which tend to lie flat on the TEM grid. The as-synthesized nanostructures were observed to have smaller thicknesses of about 10-15 nm (lateral dimension), but larger lengths and widths of about 45 nm and about 130 nm, respectively.

The size scale of the as-synthesized ellipsoids varies in the three dimensions (in the a, b and c axes) depending on the number of particles aggregates in the direction of the particular axis. TEM analysis showed that that anisotropic growth rates of the ellipsoidal particles were ordered as follows: b>a>c (or [010]>[100]>[001]), indicating different particle-aggregation potentials. Aggregation and attachment occurs preferentially between the (010) lattice planes of the nanoparticles. The preferential anisotropic growth is different from classical crystal growth of CuO nanowires along the (001) direction in the related art.

To obtain a better understanding of the anisotropic growth mechanism of ellipsoid particles, reaction products were collected at different growth stages. At an early reaction stage (about 2 hours), small CuO nanocrystals about 6-7 nm in diameter were formed, which was consistent with the subunit size of the final ellipsoidal architectures. SAED indicated preferential orientation along the (001) crystallographic axis parallel to the c-axis.

When the aging time was extended to 5 hours, removal by centrifugation left a colorless mother liquor, indicating that complete formation of CuO nanoparticles. Meanwhile some primary particles began to adhere closely. After 24 hours, the small aggregates had grown together into larger ellipsoidal nanostructures with observable boundaries or voids between particles through stacking of more particles.

Aggregation is energetically favored because the formation of larger crystals can greatly reduce the interfacial energy of small primary nanoparticles. Strong organic ligands usually promote self-assembly of nanoparticles, driven by the interactions between organic ligands adsorbed on different particles. However, weakly protected nanoparticles often undergo entropy-driven random aggregation through strong interactions between the particles themselves due to the facile desorption and exchange of ligands. In the invention, the different amounts of formamide-molecular oxygen atoms adsorbed on different surface planes may depend on the corresponding surface density of the metal atoms, i.e., copper atoms. Copper atom densities on (001), (010) and (100) planes of monoclinic CuO are calculated to be 12.5 atoms $nm^{-2}$, 8.5 atoms $nm^{-2}$ and 11.5 atoms $nm^{-2}$, respectively. The most stable surface plane is (001), with the highest density of copper atoms and where formamide molecules are adsorbed more densely, resulting in a weak aggregation driving force along the c-axis. In contrast, the least stable surface plane is (010), with the lowest density of copper atoms and where formamide molecules are adsorbed more sparsely, resulting in preferential aggregation growth along the b-axis. The self-organized aggregates gradually transform themselves into uniform ellipsoidal architectures, which are built up of much smaller primary particles. As Ostwald ripening is common process at room temperature, only the aggregation process is involved in forming the final nanoparticle-built product.

The invention can also be used to produce morphosynthesis and ornamentation of 3D dendritic nanoarchitectures. A slow and progressive production of 3D intricate nanoarchitectures under nearly sustained supersaturation of impurity-free nutrients, which are supplied statically from the natural oxidation of metal. The controllable supersaturation is important for the self-organized growth of ultrathin nanosheets into intricate 3D dendritic architectures of metal oxides in the absence of self-assembled templates or matrixes. Self-oriented dendritic nanostructures can be fabricated when a simple amino acid (preferably glycine) is used as an organic additive. However, any suitable amino acid can be used as an additive, including alanine, arginine, asparagine, aspartic acid, cysteine, glutamine, glutamic acid, glycine, histidine, isoleucine, leucine, lysine, methionine, phenylalanine, proline, serine, threonine, tryptophan, tyrosine and valine.

EXAMPLE 6

A piece of copper foil (7.0 mm×7.0 mm×0.127 mm) was laid at the bottom of a 4 mL glass vial containing a mL of 9M formamide aqueous solution (40% formamide in volume), and the mixed reaction was left standing at room temperature under an atmospheric environment for 10 days. In a similar procedure, a solution was prepared in the presence of 0.5 mM glycine.

Figure 8:
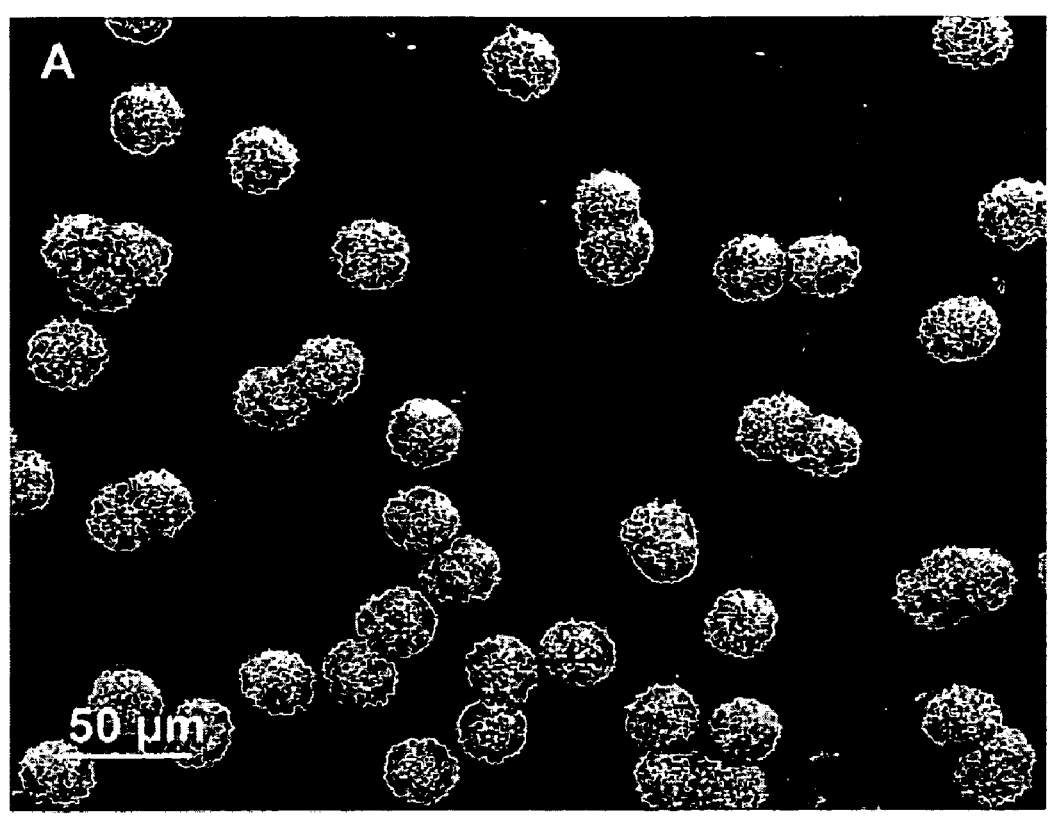
FIG. 8 shows an overview SEM image of pale blue spherulites grown on copper substrate (7.0×7.0×0.127 mm) for 6 days in 1 mL of 9 M formamide aqueous solution.
Figure 9:
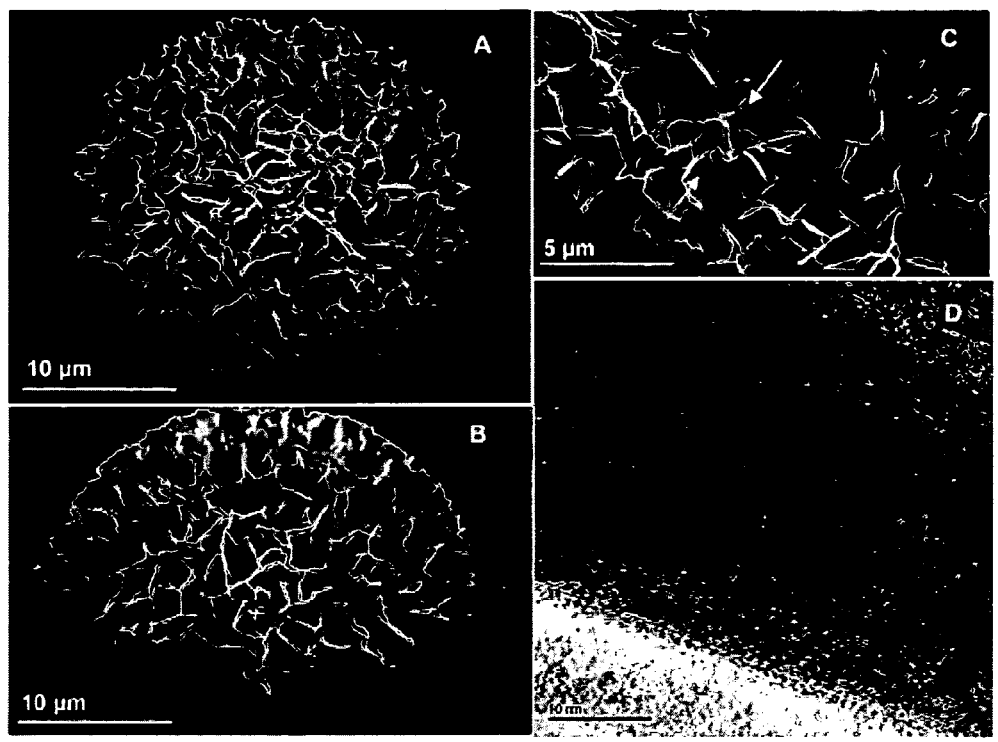
FIG. 9 shows SEM images of 3D dendritic structure of copper hydroxide crystals grown on copper substrate for 6 days in 1 mL of 9 M formamide aqueous solution: (A) top view, (B) oblique view at a tilting angle of 45, (C) cross-section view of dendritic crystals, and (D) HR-TEM image of a broken nanosheet, which was collected from copper substrate covered with dendritic crystals.

When copper foil is immersed in 9 M formamide and left at room temperature for about 6-10 days, solution color changed gradually from colorless to light blue, indicating the formation of $[Cu(HCONH_2)_4]^{2+}$ complex ions. With increasing reaction time, the resulting copper-formamide complexes are slowly transformed in CuO crystal on the substrate. Consequently, many pale blue spherulites grew onto the copper surface over time, as revealed by low magnification SEM (FIG. 8). SEM analysis also showed that single particles have a round shape and a uniform size of about 26 μm, and peanut and dumbbell shaped particles were formed when two particles merged together. The spherulites showed a dendritic flower structure made up of uniform nanosheets (FIG. 9A and FIG. 9B). The ultrathin nanosheets were about 40 nm in thickness (FIG. 9C) and were identical throughout the dendritic crystal. The highly crystalline nature of the nanosheets was revealed by the straight and parallel lattice fringes with a lattice spacing of about 0.34 nm between two adjacent (002) planes (FIG. 9D).

Figure 10:
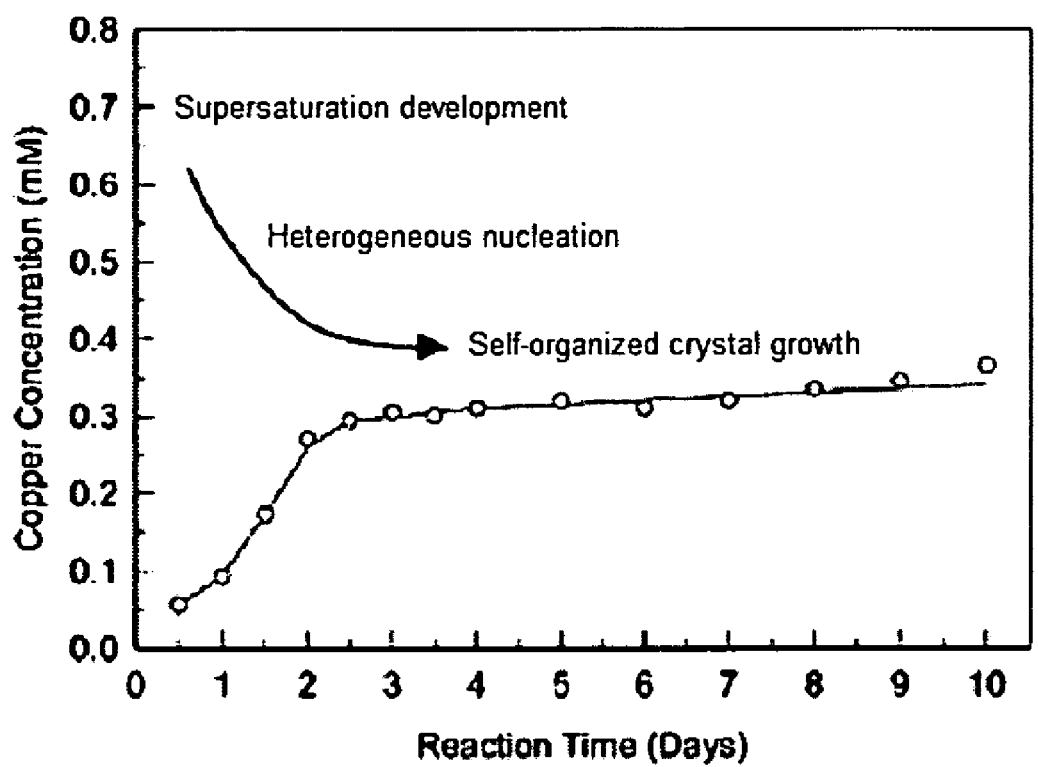
FIG. 10 shows the temporal evolution of copper concentration in 1 mL of 9 M formamide aqueous solution.
Figure 11:
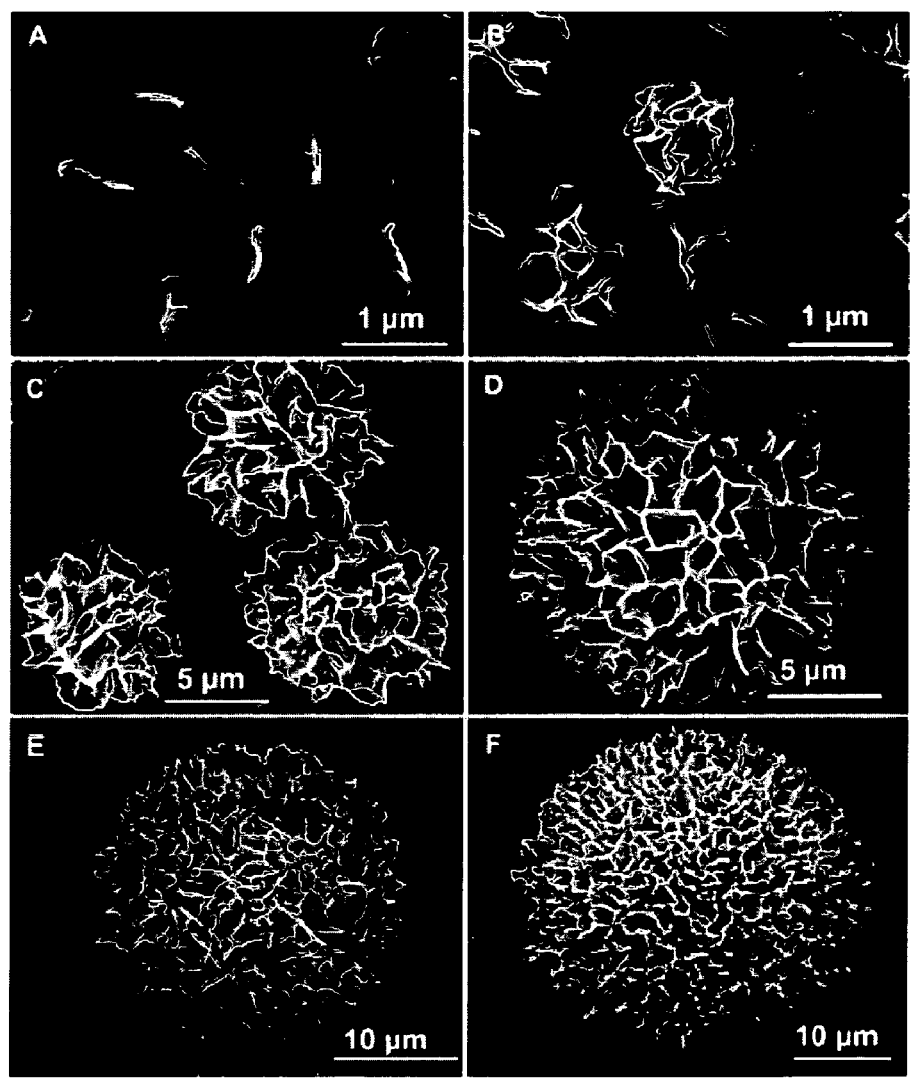
FIG. 11 shows time-dependent evolution of dendritic crystal morphology at different growth stages for 2 days (A), 3 days (B), 4 days (C), 5 days (D), 6 days (E), and 9 days (F), respectively.

The copper concentration was monitored over the reaction course of 10 days. As shown in FIG. 10, the copper concentration in solution approached 0.30 mM in the first 2 days, and very slow heterogeneous nucleation of copper hydroxide took place exclusively such that rod-like nuclei grew on the copper surface sparsely (FIG. 11A). A narrow window of copper concentration/supersaturation about 0.30 nM was further maintained in the subsequent process for crystal growth. Between the second and third day, 1D nuclei started branching on the surface and gradually formed 2D dendritic "roots" about 1 μm in size for the following growth of dendritic "flowers." (FIG. 11B). After another day, the 2D dendrites grew into small dendritic cores about 8 μm in size (FIG. 11C). Upon increasing time to 5 to 6 to 9 days, the cores expanded into fully developed dendritic architectures of about 16, 26 and 38 μm, respectively (FIG. 11D to FIG. 11F).

Figure 12:
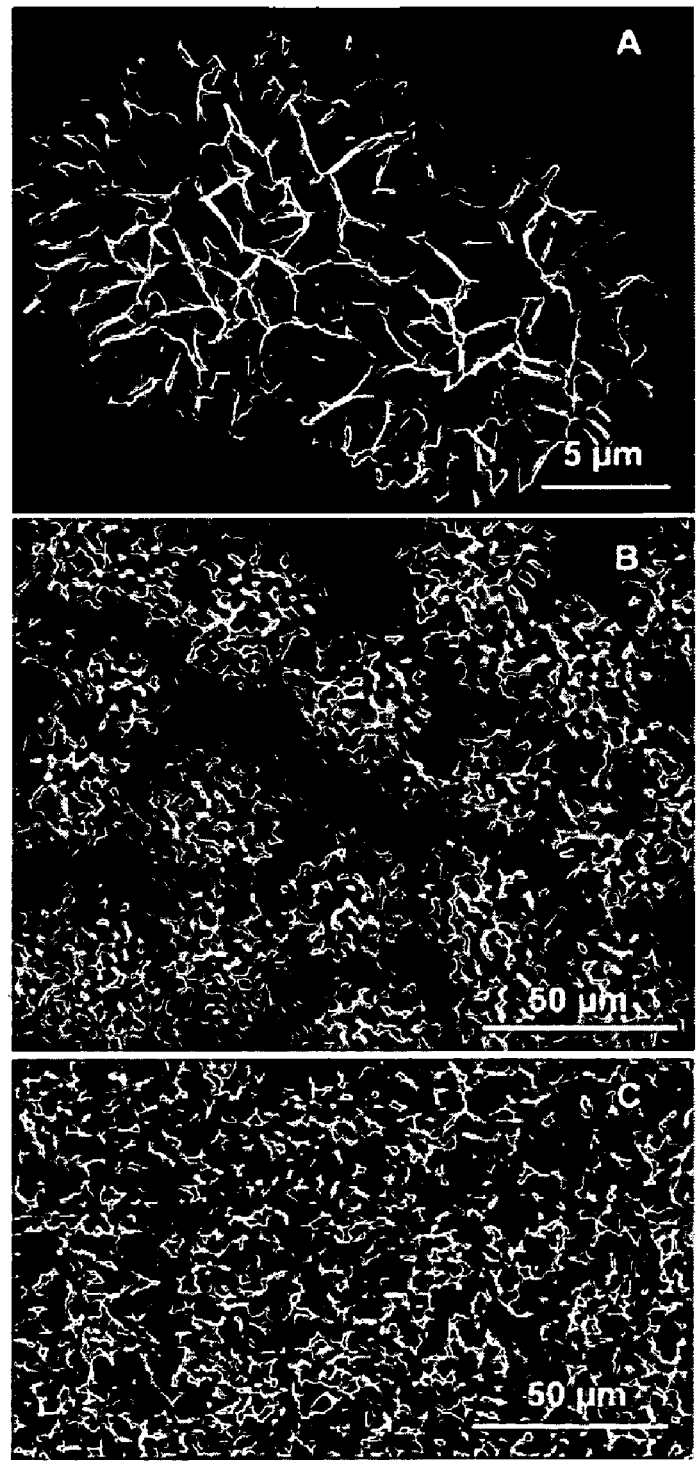
FIG. 12 shows a reaction-volume-controlled self-organized growth of highly porous dendritic architectures, where (A) shows an SEM image of a dumbbell-like dendritic crystal produced in the 1-mL reaction system after 6 days, (B) shows an SEM image of dendritic porous network produced in the 0.5-mL reaction system after 6 days, and upon increasing the time up to 10 days, and (C) shows an SEM image of a bicontinuous film-like inorganic scaffold that was gradually formed while the contour of the dendritic crystals disappeared.

FIG. 12A shows that as growth proceeds, two neighboring dendritic crystals can further expand themselves and eventually intermesh with each other to merge into an interconnected porous structure of nanosheets in their boundary area. No separate or isolated nanosheets were observed in the boundary as well.

Also, a higher density of crystal flowers was further developed on copper substrate by reducing the volume of the reaction solution. When the solution volume was reduced from 1.0 to 0.5 mL, a much denser array of dendritic crystals with a uniform size of about 35 μm covers the surface of copper substrate after the self-organized crystal growth for 6 days (FIG. 12B). This indicates that the density level of dendritic crystals on the copper surface is dependent on the reaction volume. With a relatively smaller volume, solvated $Cu^{2+}$ species can reach the supersaturation level necessary for spontaneous heterogeneous nucleation in a much shorter period of time (much less than 2 days). This shortened induction time for nucleation can lead to the formation of a relative larger number of nuclei on the substrate, which can result in a higher density array of dendritic crystals on substrate accordingly. With further increasing time, the contour of dendritic spheres gradually disappears, leading to a uniform film with a bicontinuous porous network (FIG. 12C).

Figure 13:
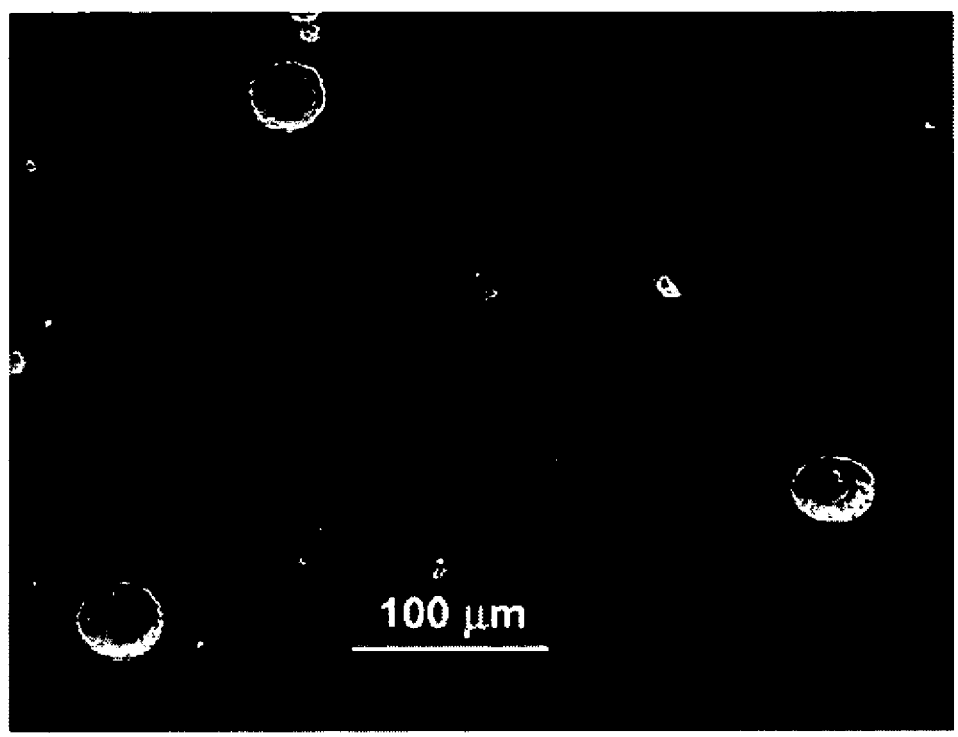
FIG. 13 shows an SEM image of shell-ornamented, dendritic spherulites of copper hydroxide grown on a copper substrate for 8 days in 1 mL of 9 M formamide aqueous solution containing 0.5 mM glycine.

The biomolecules for determining or controlling the morphologies and microstructures of copper-based mineral phase (copper hydroxide chloride) are specific proteins, which are dominated by two major amino acids, glycine (63.2%) and histidine (32.5%). In the invention, the simplest amino acid, glycine (99.0%, Aldrich), was chosen to further control and modulate the crystal growth behavior of dendritic copper-based crystals. After a piece of copper foil was immersed into 9 M formamide aqueous solutions containing 0.5 mM glycine, the metal copper was oxidized slowly by naturally dissolved oxygen in solution at room temperature. With increasing reaction time, the solution color changed gradually from colorless into light blue, indicating the formation of copper complexes. Once copper concentration/supersaturation was reached and stabilized at about 0.4-0.5 mM as determined by ICP-AES, complex dendritic copper hydroxide began to crystallize on copper substrate. After crystal growth for 8 days (FIG. 13), it is discovered that shell-capped dendritic nanoarchitectures (about 38 μm), instead of the dendritic structure itself, were produced on copper substrate, indicating that the glycine molecules strongly modified the morphology.

Figure 14:
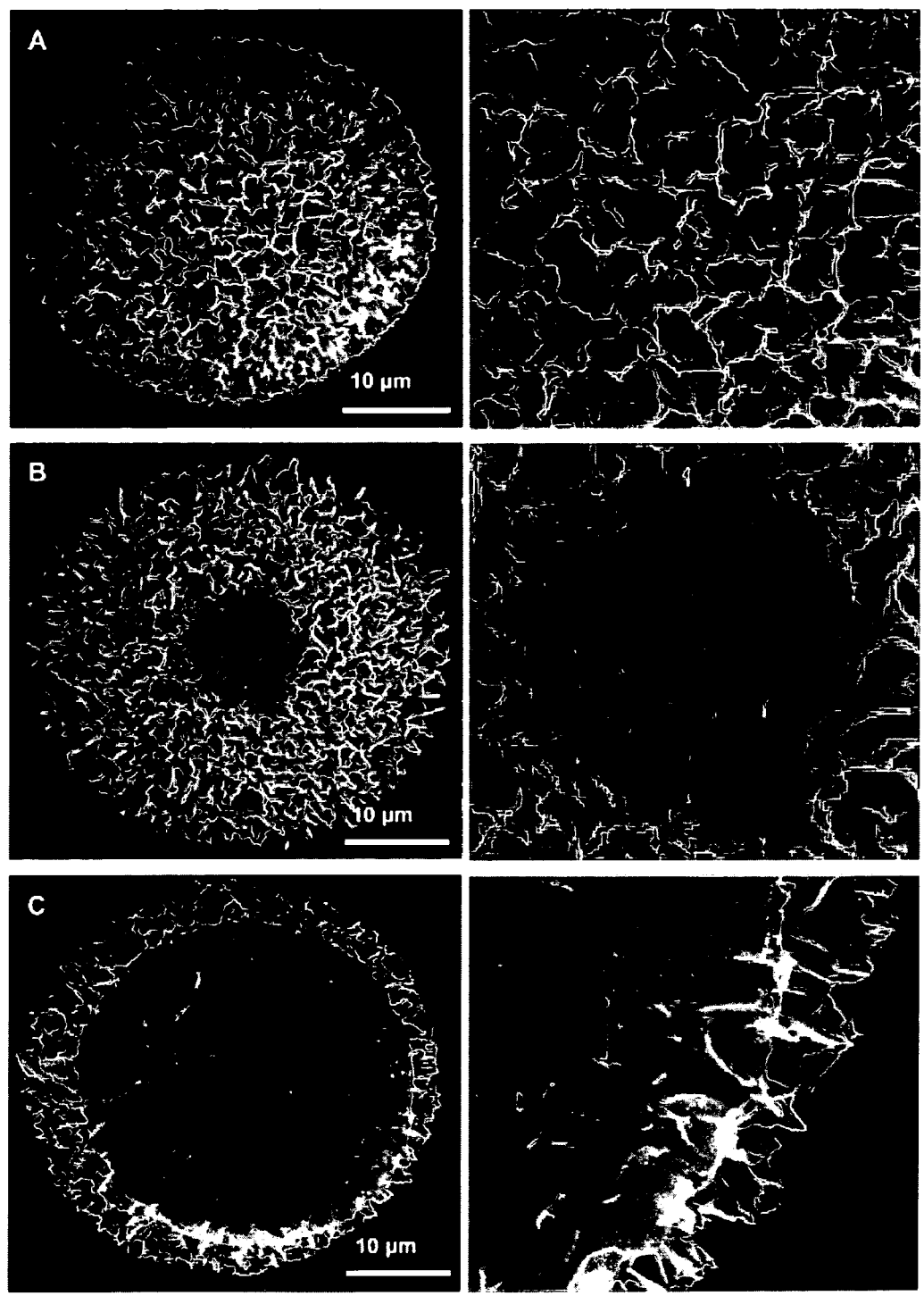
FIG. 14 shows the temporal evolution of dendritic crystal morphology by SEM at different growth times of 6 days (A), 7 days (B), and 9 days (C), respectively, and corresponding enlarged structures are shown in the right-hand images.

The SEM images in FIG. 14 monitored the morphological development of the high-order, shell-ornamented nanoarchitectures at different growth stages. In the presence of glycine, 3D dendritic architectures with highly porous network structure of nanosheets (FIG. 14A) can also be grown on a substrate after a growth for 6 days. However, there is an obvious modification effect on the structure of the obtained 3D dendritic crystals in the presence of glycine. The resulting branched nanosheets (about 20 nm in thickness) are much thinner than the ones produced in the absence of glycine (about 40 nm in thickness). Obvious scrolling or curling effects at the edge of the flexible nanosheets were observed clearly due to the ultrathin nature of the dendritic nanosheets. Another visible modification can be seen from the higher density of nanosheets and the smaller size of pores within dendritic architectures. Upon further increasing the growth time up to 7 days, interestingly, a thin layer of round membrane started to grow at the top of dendritic sphere (FIG. 14B). The membrane thickness is much thinner than that of the nanosheets in the underlying dendritic sphere. The ultrathin membrane looks almost transparent, and one can clearly see the pores in the dendritic sphere. By continuously prolonging the growth time, the membrane extended itself to form shell-ornamented dendritic architectures along the curved surface, which can also be confirmed by the thickness gradient of shell from center (thick) to edge (thin) as indicated by the image contrast (FIG. 14C). It is noted that the surface-capped shell and the underlying radial nanosheets of dendritic sphere were combined and merged altogether.

Copper hydroxide is well-known to have a layered structure. Due to the binding affinity of formamide molecules to copper atoms on the crystal surface the growth is largely inhibited in the direction perpendicular to the (001) crystal surface to form ultrathin nanosheets of about 40 nm in thickness. As compared with formamide ($HCONH_2$), glycine molecules with two functional groups ($NH_2CH_2COOH$) have higher binding affinity to copper atoms, leading to the formation of much thinner nanosheets. When nanosheets become thin enough (about 20 nm in thickness), they start scrolling naturally at the edge of the nanosheets to further decrease the branching growth rate of the nanosheets. After 7 days, secondary nucleation and crystal growth subsequently occurred on the top of the dendritic architecture as "substrate" to form a thin layer of shell-like film. The current results emphasized that glycine molecules can exhibit a significant modifying effect on the branching growth of crystals. The ability to perform such morphological transformations holds promise for creating more complex nanostructured materials.

Therefore, a progressive production of 3D dendritic nanoarchitectures built up of ultrathin nanosheets has been demonstrated in the absence of self-assembled templates or matrixes. Adjacent dendritic crystals can further expand themselves and eventually merge into continuous porous networks. High-order shell-ornamented dendritic nanoarchitectures can also be fabricated when simple glycine molecules are used as organic additives. Although the formation mechanism of 3D dendritic crystals has yet to be fully understood, this present work shows a perspective that the elaborate self-organized dendritic structures may be chemically synthesized and further decorated into shell-ornamented dendritic crystals under nearly sustained supersaturation. This novel complex forms with extremely high surface-to-volume ratio for new applications and brings new insights into the underlying mineralization mechanisms of complex nanoarchitectures in the natural and synthetic world. In addition, dendritic structures of copper hydroxide can also be converted at elevated temperature into copper oxide that could show some unique catalytic properties in many reactions of industrial importance.

In another embodiment of the invention, the metal oxide nanostructures can be prepared on different substrates that have a lattice match with the metal oxide to be deposited. For Example, ZnO nanostructures can be prepared on metallic zinc or on ZnO film-coated substrates. Also, CuO nanostructures can be prepared on metallic copper or CuO film-coated substrates. These types of metal oxide nanostructures can be formed using any appropriate transition metals and their oxides.

The invention also encompasses the oriented-aggregation growth of a limited number of nanoparticles into low-dimensional crystalline nanomaterials through linearly oriented attachment in a three-dimensional (3D) orientation and aggregation process of a few hundred nanoparticles into a single-crystalline 3D structure. An example of this process is an anisotropic aggregation-based crystal-growth process of a few hundred monoclinic CuO nanoparticles into uniform ellipsoidal monocrystalline architectures. Stepwise orientation and aggregation of a large number of nanoparticles in three dimensions has been observed, from the formation of primary CuO nanoparticles, to the preferential one-dimensional (1D) orientation of nanoparticles along the (001) direction at an early stage, and, eventually, 3D-oriented aggregation into a monocrystalline structure built from nanoparticles. Selective adsorption of formamide molecules on different crystallographic planes of monoclinic CuO nanoparticles plays an important role in the anisotropic growth of uniform nanoparticle-built monocrystals. The understanding of the oriented-attachment mechanism opens up new opportunities to fabricate complex low dimensional or 3D nanostructured materials and provide new insight into the aggregated biomineralization mechanism of nanoparticles.

Figure 15A:
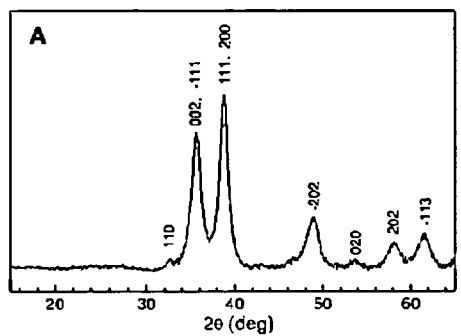
FIG. 15A shows the powder XRD pattern of crystalline monoclinic CuO.
Figure 15B:
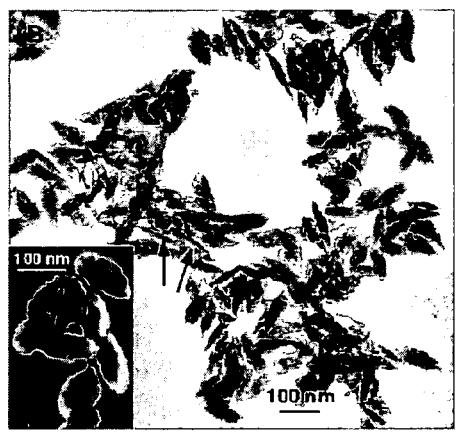
FIG. 15B shows an overview TEM image of CuO with arrows indicating ellipsoid particles and with an inset SEM image.
Figure 15C:
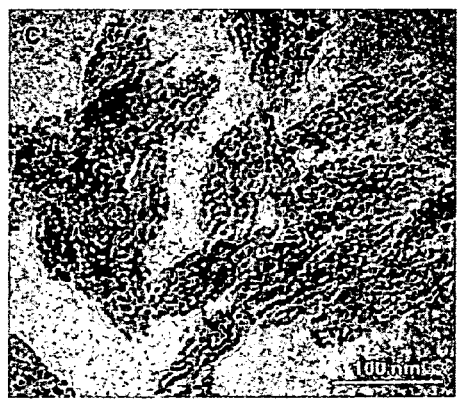
FIG. 15C shows a high-resolution TEM image of CuO.

The powder X-ray diffraction (XRD) pattern of the as-synthesized sample in FIG. 15A confirms the formation of crystalline monoclinic CuO (cupric oxide) (Joint Committee on Powder Diffraction Standards file No. 74-1021). Uniform ellipsoidal particles of cupric oxide were revealed by low-magnification transmission electron microscopy (TEM), as shown in FIG. 15B. These particles have average lengths and widths of about 130 nm and about 45 nm, respectively. The high-magnification TEM image in FIG. 15C reveals the unusual texture of the particles, which are built up of numerous small nanoparticles roughly 6-7 nm in size. It appears that these primary small nanoparticles interconnect with one another to form larger secondary ellipsoidal architectures with recognizable boundaries or voids between the component subunits. An average particle size in good agreement with the TEM observation was determined from the X-ray diffraction data using the Debye-Scherrer formula. The XRD line broadening results from the small grain sizes of the ellipsoidal aggregates, lattice imperfections, and stacking faults in the contacting/connecting areas between neighboring particles. This provides further insight into the mechanism of aggregation growth of small cupric oxide nanoparticles.

Figure 16A:
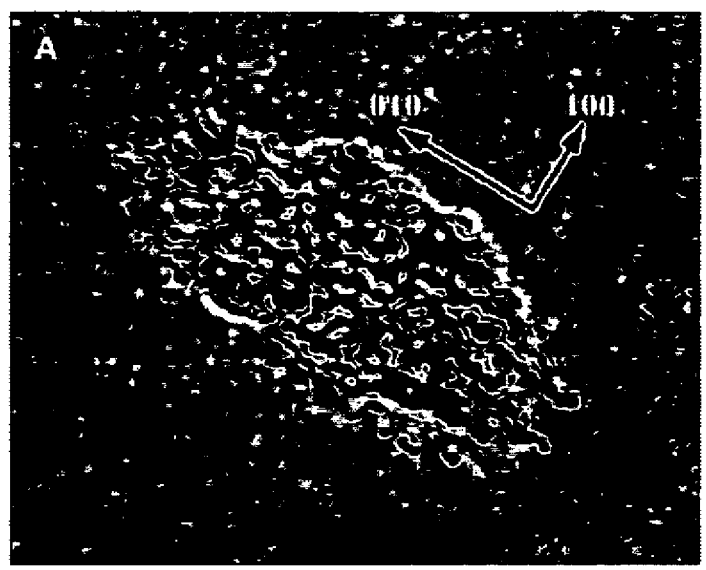
FIG. 16A shows a high resolution TEM image of a single CuO ellipsoidal particle.
Figure 16B:
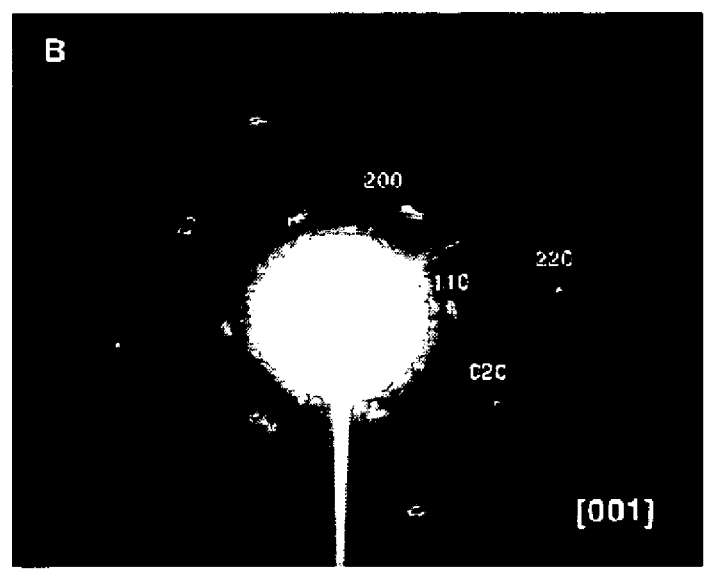
FIG. 16B shows a selected area electron diffraction (SAED) pattern of a single CuO ellipsoidal particle.

The high-resolution (HR) TEM image of a single ellipsoidal nanostructure in FIG. 16A clearly shows the obvious aggregation of small nanoparticles. The selected area electron diffraction (SAED) pattern of the same single nanoarchitecture in FIG. 16B can also be indexed to the monoclinic structure of cupric oxide with phase purity. It is surprising that the nanostructure built up from particles exhibits an almost single-crystalline diffraction pattern with its spot-like appearance along the [001] axis of crystalline cupric oxide. The slightly elongated diffraction spots suggest the presence of multiple nanodomains with a small misorientation deviating from perfect alignment between nanocrystallites in the resulting ellipsoidal nanoarchitecture. The average orientation distribution was estimated to be about 5°, measured from the arc angles/lengths in the diffraction pattern. The elongated diffraction spots in SAED may result from lattice orientation imperfections among the primary particles prepared at room temperature. This is referred to as imperfect-orientation attachment in hydrothermally treated anatase and bio-generated iron oxyhydroxide.

It was also observed that all the SAED patterns of single isolated ellipsoids show identical diffraction patterns along the [001] direction of cupric oxide. This is attributed to the flat nature of the ellipsoidal particles, which tend to lie flat on the TEM copper grid as shown in FIG. 15B. In fact, several rod-like particles were also observed in the overview TEM image in FIG. 15B. This is because ellipsoidal particles lying on their side by chance can display a rod-like shape with very thin tips (as indicated by arrows). The as-synthesized nanostructures may thus have smaller thicknesses of roughly 10-15 nm (lateral dimension), but larger lengths and widths of about 130 nm and about 45 nm, respectively.

Figure 17:
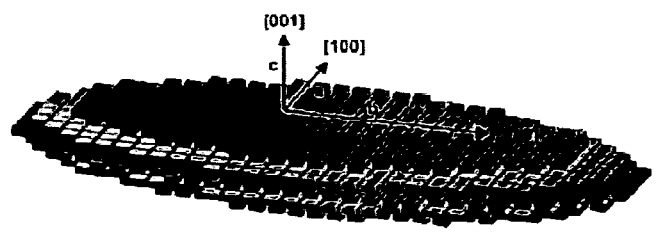
FIG. 17 shows a schematic illustration of a single-crystalline assembly of cupric oxide built from aggregated nanoparticles

The aggregation-based growth of a few hundred nanoparticles into single-crystalline assemblies of CuO nanoparticles is schematically illustrated in FIG. 17. The size scales of the as synthesized ellipsoids are very different in all three dimensions (in the a-, b-, and c-axes). It depends on the number of particles aggregated in the direction of the particular axis. From the TEM images shown in FIG. 15C and FIG. 16A, anisotropic growth rates of the ellipsoidal particles are ordered as follows: b>a>c (or [010]>[100]>[001]), indicating different particle-aggregation potentials. Aggregation and attachment occurs preferentially between the (010) lattice planes of nanoparticles. The preferential anisotropic growth is different from the classical crystal growth of cupric oxide nanowires or nanotubes along the [111] direction reported in the literature.

To obtain a better understanding of the anisotropic growth mechanism of ellipsoidal particles, reaction products were collected at different growth stages for TEM and SAED investigation (FIG. 18). At an early reaction stage (after 2 hours), small CuO nanocrystals about 6-7 nm in diameter were formed, as shown in FIG. 18A. The particle size is consistent with the subunit size in the final ellipsoidal architectures. This provides direct evidence that the architecture did result from particle-by-particle aggregation growth rather than classical atom-by-atom addition. The SAED in FIG. 18A, taken from the dense region of primary particles, shows typical diffraction rings from polycrystalline CuO. The (110), (200), and (020) rings can be assigned to the diffraction pattern of CuO along the [001] zone axis, which is further confirmed by simulated electron diffraction patterns of mono- and polycrystalline CuO. The specific diffraction pattern suggests that these small nanoparticles have preferentially oriented their [001] crystallographic directions parallel to the c-axis. However, their [100] and [010] directions are still random, which leads to polycrystalline diffraction rings along the [001] axis. The HRTEM image in FIG. 18B reveals the crystalline nature of a few CuO nanoparticles with straight (200) lattice fringes. The orientation of the CuO particles at an early stage was also disclosed by the observation of identical (200) lattice planes, but with various lattice directions, in these primary particles, indicating that the preferential orientation of their [001] crystal directions is parallel to the c-axis.

Figure 18A:
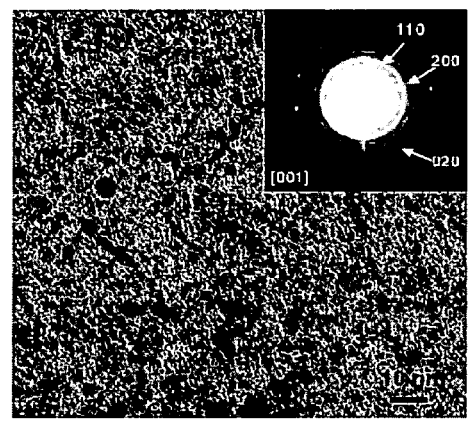
FIG. 18A shows a TEM image and SED pattern of the early stage formation of nanoparticles of CuO.
Figure 18B:
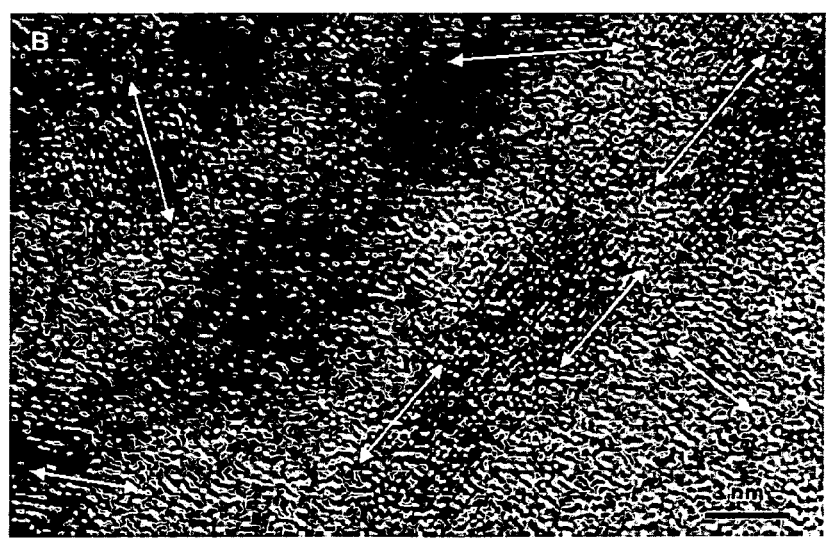
FIG. 18B shows an HRTEM image with identical (200) lattice planes in the primary particles with various lattice directions being indicated by arrows.
Figure 18C:
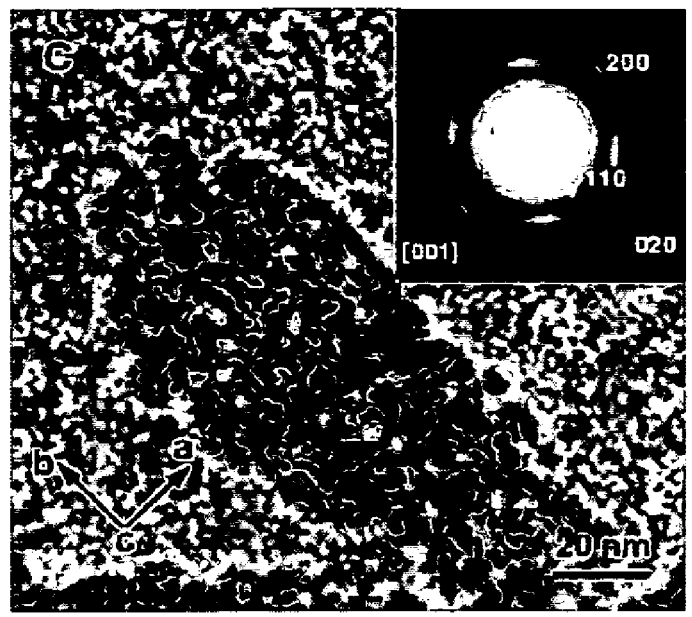
FIG. 18C shows a TEM image and SED pattern of an intermediate stage after 24 hours of aging of a few hundred primary nanoparticles into a loosely organized aggregate.
Figure 18D:
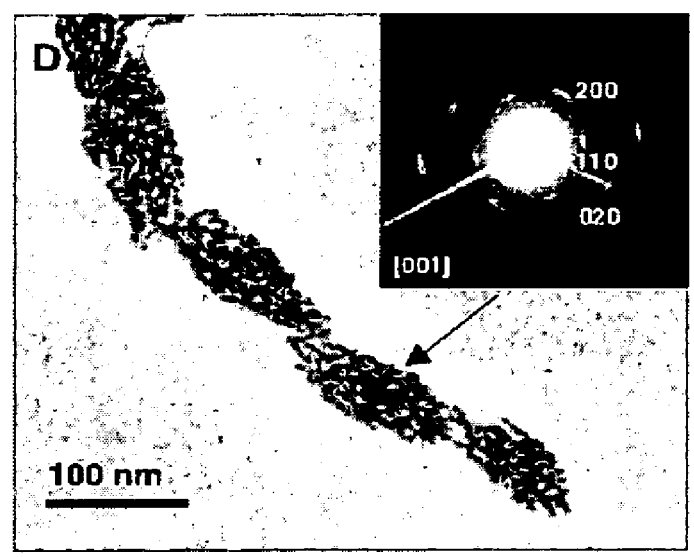
FIG. 18D shows a TEM image and SED pattern of a stage after 1 week of aging of a single-crystalline nanoarchitecture.
Figure 19:
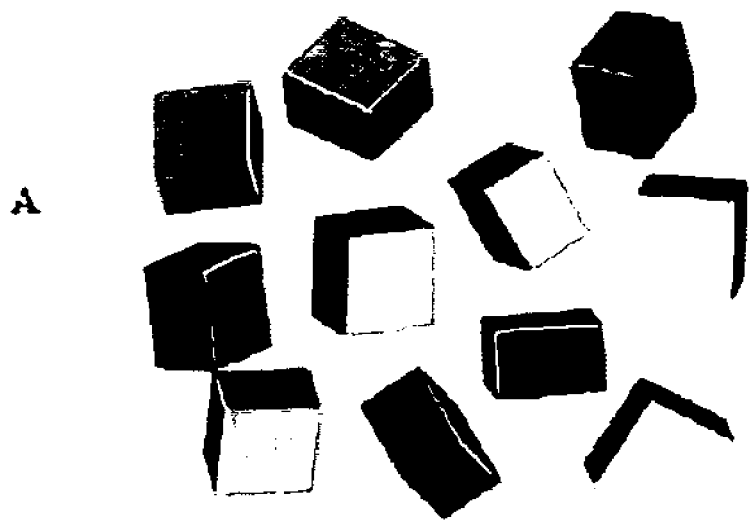
FIG. 19 shows a schematic illustration of stewise orientation and aggregation of a large number of primary particles into a monocrystalline structure.
Figure 19:
Figure 19:
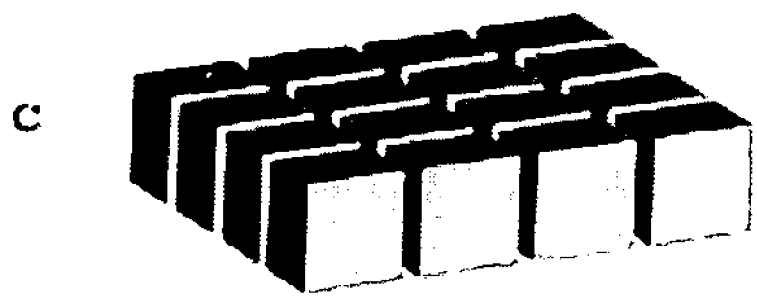
Figure 19:
Figure 19:
Figure 19:

When the aging time was extended to 5 hours, CuO nanoparticles in the mother solution can be removed by centrifugation to leave a colorless supernatant solution, indicating the complete depletion of copper-complex precursors or complete formation of CuO nanoparticles. Meanwhile, some primary particles began to stick together loosely. After 24 hours, these small aggregates had grown into larger ellipsoidal nanostructures with observable boundaries or voids between particles through stacking of more particles (FIG. 18C). All primary nanoparticles in the reaction solution were completely organized into larger aggregates because none of them were observed in the mother solution by TEM. The SAED pattern of the single aggregate (FIG. 18C) shows bright diffraction arcs accompanied by faint [001] polycrystalline rings. Those bright arcs correspond to the diffraction spots of the crystalline CuO architecture, which clearly reveals that small particles in aggregates have roughly oriented their [100] and [010] crystallographic directions to common a- and b-axes, respectively. The orientation along the [100] and [010] crystallographic directions thus weakens the intensity of the diffraction rings, as shown in FIG. 18C. During subsequent aging for a week, the secondary particles further undergo restructuring and rearrangement, resulting in more compact and regular ellipsoidal aggregates (FIG. 18D). A large number of CuO nanoparticles in the aggregates adopted identical crystallographic directions in all three dimensions. FIG. 18D also shows the clear diffraction spots of a single monoclinic cupric oxide aggregate, which is the same as the one in FIG. 16B. The above results demonstrate a three-step growth process to form final organized aggregates in our reaction system, as shown in FIG. 19.

Aggregation is energetically favored because the formation of larger crystals can greatly reduce the interfacial energy of small primary nanoparticles. Strong organic ligands usually promote self-assembly of nanoparticles, driven by the interactions between organic ligands adsorbed on different particles. However, weakly protected nanoparticles often undergo entropy-driven random aggregation through strong interactions between the particles themselves due to the facile desorption and exchange of ligands. The moderate binding affinity of ligands such as formamide to transition metal ions such as copper or zinc ions may provide the capability for controlled removal of the appropriate organic ligands at interfaces for subsequent oriented attachment of nanoparticles to form ordered aggregates. Although the oxygen and nitrogen of formamide molecules are candidate donor atoms for coordination to copper ions, it was observed by IR and extended X-ray absorption fine structure (EXAFS) spectroscopy that the molecular structure of the formamide molecule prevents the nitrogen atoms from acting as coordinating atoms to form $Cu(HCONH_2)_4^{2+}$.

As has been observed, the different amounts of formamide-molecule oxygen atoms adsorbed on different surface planes may depend on the corresponding surface density of copper atoms. Copper atom densities on (001), (010), and (100) planes of monoclinic CuO are calculated to be 12.5 atoms $nm^{-2}$, 8.5 atoms $nm^{-2}$, and 11.5 atoms $nm^{-2}$, respectively. The most stable surface plane should be (001), with the highest density of copper atoms and where formamide molecules are adsorbed more densely, resulting in a weak aggregation driving force along the c-axis. In contrast, the least-stable surface plane should be (010), with the lowest density of copper atoms and where formamide molecules are adsorbed more sparsely, resulting in preferential aggregation growth along the b-axis. The difference in the amount of formamide molecules adsorbed on various crystal-lographic planes may lead to the anisotropic aggregation based growth of primary particles. The self-organized aggregates gradually transform themselves into uniform ellipsoidal architectures, which are built up of much smaller primary particles as shown in FIG. 1C. As in our case Ostwald ripening is not an obvious process at room temperature, only the aggregation process is involved in forming the final nanoparticle-built product. This is why one can observe the clear stepwise orientation and aggregation of a few hundred nanoparticles into defective single-crystalline architectures in three dimensions.

In the invention formamide ($HCONH_2$) was utilized as the preferred complexing agent. However, the invention is not restricted to formamide and similar compounds (and mixture thereof) can be used, such as dimethylformamide ($HCON(CH_3)_2$), diethylformamide ($HCON(CH_2CH_3)_2$), dipropylformamide ($HCON(CH_2CH_2CH_3)_2$), N-butylformamide (HCONH-n-butyl), isobutylformamide (HCONH-iso-butyl) and tertbutylformamide (HCONH-tert-butyl). Also, the invention can be practiced using not only amides, but with any suitable ligand that can form metal complexes, which includes ligands having functional groups such as amine, carboxyl, aldehyde, etc. Although the preferred metals of the invention include Zn, Cu, Fe and Ni, any transitional metal can be used. The suitable metals for the invention include, but are not restricted to: Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au and Hg.

It will be apparent to those skilled in the art that various modifications and variations can be made in the invention without departing from the spirit or scope of the invention. Thus, it is intended that the invention covers the modifications and variations of this invention provided they come within the scope of the appended claims and their equivalents.

What is claimed is:

1. A method for manufacturing a ZnO nanostructure, comprising:
   oxidizing Zn metal in the presence of a solution containing a ligand to form a metal-ligand complex; and
   decomposing the metal-ligand complex to form the ZnO nanostnicture,
   wherein the decomposition of the metal-ligand complex is performed on a ZnO coated substrate.

2. The method of claim 1, wherein the ligand is a group consisting of $HCONH_2$, $HCON (CH_3)_2$, $HCON (CH_2CH_3)_2$, $HCON(CH_2CH_2CH_3)_2$, HCONH-n-butyl, HCONH-iso-butyl and HCONH-tert-butyl.

3. The method of claim 1, wherein the metal-ligand complex is Zn-formamide.

4. The method of claim 1, wherein the decomposing is performed in the presence of dissolved oxygen.

5. The method of claim 1, wherein the ZnO nanostructure comprises ZnO nanorods.

6. The method of claim 5, wherein the ZnO nanorods have a diameter of 10 to 1000 nm.

7. The method of claim 1, wherein the solution comprises a 2-10% aqueous solution of $HCONH_2$.

8. The method of claim 1, wherein the solution further comprises an ammo acid.

9. The method of claim 1, wherein the method is performed at a temperature of 0-100° C.

10. The method of claim 9, wherein the temperature is 65° C.

11. The method of claim 1, wherein oxygen is dissolved in the solution.

12. The method for manufacturing a ZnO nanostracture of claim 1, wherein decomposing the metal-ligand complex to form the ZnO nanostructure is performed on a substrate having a lattice match with the ZnO.

13. A method for manufacturing a ZnO nanostructure, comprising: immersing Zn metal in a solution of 2-10% aqueous $HCONH_2$, wherein the ZnO nanostructure is formed on a ZnO coated substrate.

14. The method of claim 13, wherein the metal comprises a zinc foil.

15. The method of claim 13, wherein the method is performed at a temperature of 65° C.

16. The method of claim 13, wherein the nanostructure comprises ZnO nanorods having a diameter of 10 to 1000 nm.

* * * * *

UNITED STATES PATENT AND TRADEMARK OFFICE
CERTIFICATE OF CORRECTION

PATENT NO.        : 7,485,488 B2                                                                 Page 1 of 1
APPLICATION NO.   : 11/104581
DATED             : February 3, 2009
INVENTOR(S)       : Mingyong Han et al.

It is certified that error appears in the above-identified patent and that said Letters Patent is hereby corrected as shown below:

IN THE SPECIFICATION:
At column 4, line 51, change "ten" to --tens--.
At column 6, line 34, change "nM" to --mM--.
At column 10, line 50, change "containing a mL" to --containing 1 mL--.

IN THE CLAIMS:
Claim 1, line 6 (at column 16, line 39), change "nanostnicture" to --nanostructure--.
Claim 2, lines 1-2 (at column 16, lines 42-43), change "wherein the ligand is a group consisting of" to --wherein the ligand is a liquid amine that is at least one compound selected from the group consisting of--.
Claim 8, line 2 (at column 16, line 57), change "an ammo acid" to --an amino acid--.
Claim 12, line 1 (at column 16, line 64), change "nanostracture" to --nanostructure--.

Signed and Sealed this
Seventh Day of June, 2011

David J. Kappos
*Director of the United States Patent and Trademark Office*